United States Patent [19]

Anderson

[11] 3,716,907

[45] Feb. 20, 1973

[54] METHOD OF FABRICATION OF SEMICONDUCTOR DEVICE PACKAGE

[75] Inventor: Charles Ernest Anderson, Melbourne Beach, Fla.

[73] Assignee: Harris-Intertype Corporation, Wilmington, Del.

[22] Filed: Nov. 20, 1970

[21] Appl. No.: 91,311

[52] U.S. Cl. ..................29/470.9, 29/471.1, 29/490, 29/492, 29/502, 29/590, 29/626

[51] Int. Cl. ..............................................B23k 1/20

[58] Field of Search..........29/589, 590, 470.9, 471.1, 29/471.9, 490, 492, 502, 626

[56] References Cited

UNITED STATES PATENTS

| | | | |
|---|---|---|---|
| 2,763,822 | 9/1956 | Frolo et al. | 29/589 UX |
| 3,025,439 | 3/1962 | Anderson | 29/590 X |
| 3,128,545 | 4/1964 | Cooper | 29/589 X |
| 3,371,148 | 2/1968 | Roques et al. | 29/626 X |
| 3,430,335 | 3/1969 | Gee | 29/590 X |
| 3,461,462 | 8/1969 | Ruggiero | 29/590 X |
| 3,470,611 | 10/1969 | McIver et al. | 29/590 |
| 3,501,681 | 3/1970 | Weir | 29/590 X |
| 3,585,713 | 6/1971 | Koneda et al | 29/590 X |
| 3,200,490 | 8/1965 | Clymer | 29/502 X |
| 3,207,838 | 9/1965 | McCormack | 29/492 X |
| 3,429,029 | 2/1969 | Langdon et al | 29/492 X |
| 3,436,818 | 4/1969 | Merrin et al. | 29/470.9 X |

*Primary Examiner*—J. Spencer Overholser
*Assistant Examiner*—Ronald J. Shore
*Attorney*—Yount and Tarolli

[57] ABSTRACT

Method of electrically interconnecting two electrical components, e.g. a semiconductor chip and a substrate, via contacts formed of aluminum, gold or silver by joining the contacts with a body of metal containing germanium and the same metal from which the contacts are formed, and heating the body of metal to the melting temperature of the eutectic alloy formed between germanium and the alloy.

6 Claims, 8 Drawing Figures

INVENTOR
CHARLES ERNEST ANDERSON

BY Yount and Tarolli
ATTORNEYS

INVENTOR
CHARLES ERNEST ANDERSON

BY Yount and Tarolli
ATTORNEYS

METHOD OF FABRICATION OF SEMICONDUCTOR DEVICE PACKAGE

This invention relates to the semiconductor art and, more particularly, to a semiconductor device package and method of fabrication.

The invention is particularly applicable to the formation of packages comprising semiconductor integrated circuits and supporting substrates therefor, and will be described with particular reference thereto. However, it will be appreciated that the invention has broader applicability and may be used in the fabrication and assembly of other types of electrical components.

The commercial success of semiconductor integrated circuits stems primarily from their ability to accommodate extremely high densities of electronic devices on very small light weight chips or wafers of semiconductor material.

This very attribute coupled with the inherent brittleness of the semiconductor material have created certain problems in handling and utilizing integrated circuit components. For example, the high density of electronic devices militates against the use of wire leads to electrically interconnect discrete devices in an integrated circuit. Further, the delicate and brittle characteristics of the semiconductor material require protection against damage by shock.

Commercially acceptable electrical interconnections of the type described above must be reproducible and highly reliable. Not only must the interconnections be physically strong, but they must also provide a good ohmic characteristic.

Heretofore substantial success has been achieved in providing satisfactory electrical interconnections in the formation of an integrated circuit package, using the following procedure. A nonconductive substrate, such as a high alumina composition, is provided first with a semiconductor layer, such as silicon, followed by a conductive metal layer, such as gold. The substrate is then masked and etched to provide a conductive pattern having terminal portions adapted to register with terminal pads on a silicon chip containing an integrated circuit. The conductive pads on the silicon chip are formed in a conventional manner, for example, by evaporating a conductive metal, such as gold, over a refractory metal, such as molybdenum.

The terminal portions of the conductive pattern on the substrates are brought into engagement with the contact pads on the silicon chip and heated. At the substrate side of the joint a gold-silicon eutectic alloy is formed, and at the silicon chip side of the joint a gold-molybdenum alloy is formed. The gold in the silicon chip conductive pad alloys to the gold and silicon on the substrate forming a strong mechanical and electrical joint.

I have found, in accordance with the present invention, that a further improvement in electrical interconnections of the type described above, can be achieved by forming the terminals on the substrate and the contact pads on the silicon chip of the same metal, and then forming a bond with a second metal which forms a eutectic alloy with the metal forming the contact pads and terminals.

More specifically, in accordance with one aspect of the present invention, there is provided a method of electrically interconnecting first and second electrical components through at least one electrical contact on each component formed of the same metal selected from the group consisting of aluminum, silver and gold, comprising depositing on the contact on one of the components, a body of metal the outer surface of which consists of an alloy of the selected metal and germanium. Thereafter the contact on the other component is brought into engagement with the body of metal and the interface is heated to the melting temperature of the eutectic alloy formed between the selected metal and germanium, whereby intimate bonding occurs between the body and the contacts upon cooling.

In accordance with another aspect of the present invention there is provided a semiconductor device package comprising a semiconductor chip having at least one electrical contact formed of a metal selected from the group consisting of aluminum, silver and gold, an insulative substrate having at least one electrical contact formed of the selected metal, and an electrically conductive bond bridging the metal contacts comprising the eutectic alloy of the selected metal and germanium.

It is therefore an object of the invention to provide an improved method of electrically interconnecting first and second electrical components, for example a semiconductor chip and a substrate, to provide an electrically conductive bond which is mechanically strong and has good ohmic characteristics.

Another object of the invention is to provide, between two electrical components each having a contact formed from the same metal selected from the group consisting of aluminum, silver and gold, an electrical interconnection formed predominately of a eutectic alloy of germanium and the metal forming the contacts.

A further object of the invention is to provide an improved semiconductor device package.

Yet another object of the invention is to provide a semiconductor chip bonded to a substrate through a eutectic alloy of germanium and a metal selected from the group consisting of aluminum, silver and gold.

These and other objects and advantages of the invention will become apparent from the following detailed description when taken in conjunction with the accompanying drawings in which.

Figure 1:
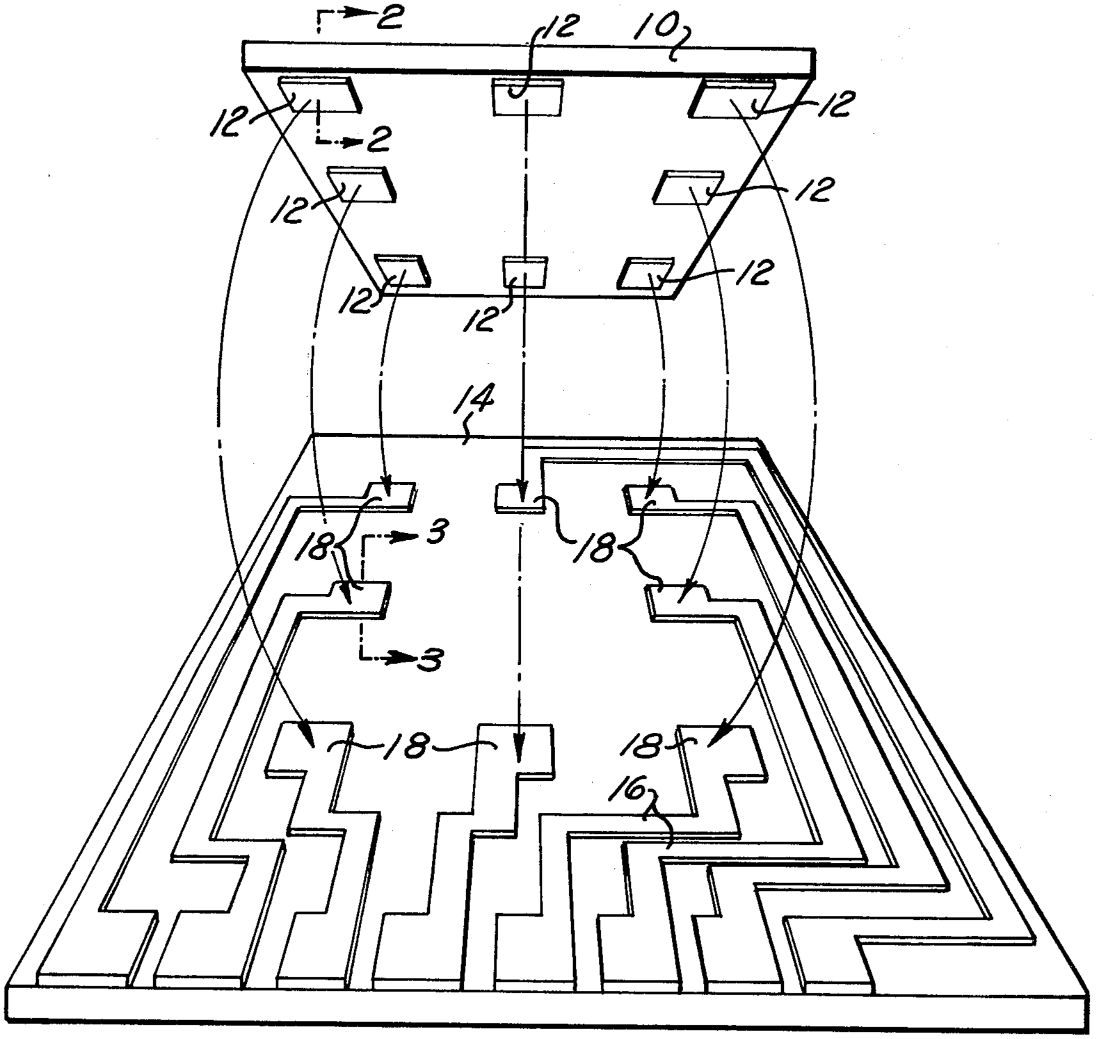
FIG. 1 is a schematic, pictorial view of two electrical components prior to being interconnected in accordance with the present invention.
Figure 2:
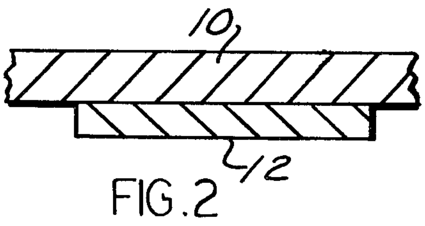
FIG. 2 is a schematic fragmentary section view taken along line 2—2 of FIG. 1.

Turning to the drawings, FIG. 1 shows first electrical component 10, which in the embodiment illustrated takes the form of a semiconductor chip or wafer having thereon one or more electrical devices, or a complete circuit (not shown). The wafer may be formed from a variety of semiconductor materials, although silicon is preferred. As illustrated in FIGS. 1 and 2, one surface of semiconductor chip 10 is provided with a plurality of metal contact pads 12. For purposes of this invention these metal pads are formed of a metal selected from the group consisting of gold, aluminum and silver.

Also shown in FIG. 1 is a second electrical component 14 which in the embodiment illustrated takes the form of an insulative substrate provided with a plurality of conductive metal strips 16. The insulative substrate may be formed of a variety of materials including $Al_2O_3$, BeO, $SiO_2$ or a wide variety of nonconducting glasses.

Figure 3:
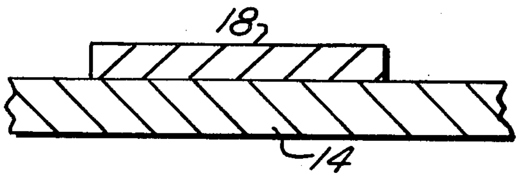
FIG. 3 is a schematic section view taken along line 3—3 of FIG. 1.

As shown in FIGS. 1 and 3 metal contact strips 16 are provided with terminals 18 which are suitably positioned for registry and engagement with metal pads 12 on the semiconductor chip 10.

For reference purposes, the semiconductor chip is generally only about 0.1 inches square and about 0.02 inches thick. It will therefore be appreciated that the electrical contacts to be dealt with are exceedingly small.

Figure 4:
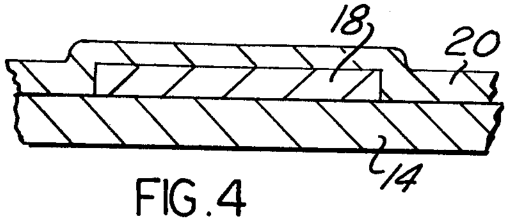
FIG. 4 is a schematic fragmentary section view of an electrical component carrying a protective layer of dielectric material.
Figure 5:
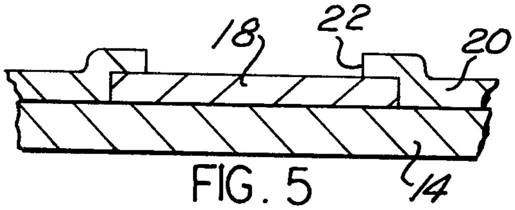
FIG. 5 is a schematic fragmentary section view similar to FIG. 4 showing a window opened in the protective layer of dielectric material.
Figure 6:
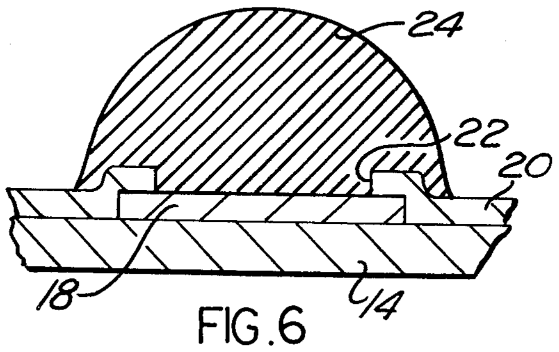
FIG. 6 is similar to FIG. 5 and shows a body of metal deposited in the opened window.

FIGS. 4 through 8 illustrate the condition of electrical components 10, 14, following each of a series of manipulative steps defining the method of the invention. The initial steps illustrated in FIGS. 4, 5 and 6 are, for purposes of illustration only, practiced on substrate 14. It will be appreciated, however, that these steps may also be practiced on semiconductor chip 10.

As a first step, illustrated in FIG. 4, a layer of dielectric material 20 is deposited on substrate 14, overlying terminal portions 18 of metal contact strips 16 (not shown). The layer of dielectric material serves the purpose of protecting metal contact strips 16 and terminal portions 18 from degradation during subsequent operations.

Dielectric 20 may be composed of a variety of materials including SiO, $SiO_2$, $Si_3N_4$, $Al_2O_3$, BeO and the like. Any of a number of well known techniques may be employed in depositing the layer of dielectric material. These include vacuum evaporation, sputtering, and in the case of silicon-containing dielectrics, low temperature oxidation of $SiH_4$ vapor.

As a next step, illustrated in FIG. 5, windows 22 are opened in dielectric material 20 using standard photoresist and etching procedures, well known to those having ordinary skill in the art. In this manner, portions of the metal forming terminals 18 are exposed for further treatment.

With reference to FIG. 6, a body of metal or "bump" 24 is deposited in window 22 establishing contact with the exposed portions of terminal 18. The body of metal may be deposited by any one of a number of well known procedures. These include mechanical deposition techniques, e.g. vacuum deposition through metal pattern masks, silk screening, etc.; or by photographic delineation techniques, e.g. electroforming, vacuum deposition and photoresist etching; and combinations of the foregoing. Selection of a particular technique will depend upon the particular metal to be deposited and the degree of pattern accuracy required.

The amount of metal deposited in window 22, and more particularly the height of metal, will depend upon the depth of any irregularities which may exist in the surfaces of chip 10 and substrate 14. The height of the "bump" should be sufficient to compensate for irregularities in the surfaces of the chip and substrate. In general, a height of 0.0005 inches is adequate, and lesser heights are tolerable where the surfaces of the two components to be interconnected are quite smooth.

In accordance with the invention, deposited metal 24 will comprise an alloy of a metal selected from the group consisting of aluminum, silver and gold, with germanium. The deposited metal may be formed of an outer layer of the alloy, surrounding a core of the selected metal, i.e. aluminum, silver or gold. Alternatively, the deposited metal consists entirely of the alloy of the selected metal with germanium.

Where the selected metal is aluminum, the alloy will contain up to about 67 wt% germanium, and preferably from about 54 to about 64 wt% germanium.

Where the selected metal is silver, the alloy will contain up to about 22 wt% germanium, and preferably from about 12 to about 22 wt% germanium.

Where the selected metal is gold, the alloy will contain up to about 34 wt% germanium, and preferably from about 19 to about 34 wt% germanium.

Figure 7:
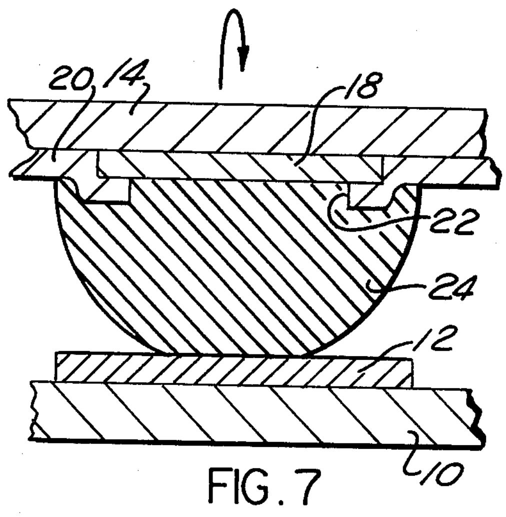
FIG. 7 illustrates the electrical component of FIG. 6 in engagement with a second electrical component prior to bond formation; and, FIG. 8 is a schematic fragmentary section view similar to FIG. 7 showing the bond formed between the first and second electrical components.

FIG. 7 shows substrate 14 inverted over chip 10 so that the deposited metal 24 depends therefrom and can be brought into engagement with metal contact pad 12.

Figure 8:
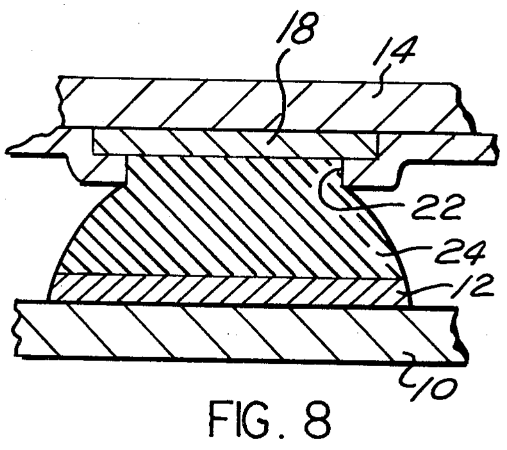

FIG. 8 illustrates the step of applying heat and optionally pressure to the interface formed by deposited metal 24 and contact pad 12. Sufficient heat is applied to raise the temperature of the body of metal and the contact pad to the melting point of the eutectic alloy formed by germanium and the other metal it comprises. Thereafter the resulting bond is permitted to cool. In some instances it may be desirable to apply ultrasonic energy to the interface between the contact pad 12 on wafer chip 10 and deposited metal 24 to insure the disruption of films of oily oxide or the like which may be on either of these surfaces.

The melting temperatures for the various eutectic alloys which may be used in the practice of the invention are as follows:

| | |
|---|---|
| aluminum-germanium | 424°C |
| silver-germanium | 651°C |
| gold-germanium | 356°C |

Depending upon the alloy employed, sufficient heat, and optionally, pressure, should be employed to raise the temperature of deposited metal 24 and contact pad 12 to the appropriate eutectic melting temperature. Heating may be accomplished in any conventional manner, for example, by conduction through contact pad 12 or terminal 18. Alternatively the entire assembly may be heated in an oven by radiation.

In some instances it may be desirable to provide the resulting package with additional protection against dust, humidity and shock. This can be accomplished by capsulating the entire package in a plastic material, such as an epoxy resin, after affixing suitable external leads.

The invention has been described in conjunction with certain structural embodiments; however, it will be appreciated that various structural changes may be made in the illustrated embodiments without departing from the intended scope and spirit of the present invention.

Having thus described my invention, I claim:

1. A method of electromechanically joining a plurality of spaced-apart terminal pads on an integrated circuit chip to a correspondingly positioned plurality of spaced-apart terminals pads on a substrate, wherein each of said terminal pads is composed of the same metal selected from the group consisting of gold, silver, and aluminum, said method comprising depositing a layer of insulative material over the surface of one of said chip and said substrate on which the respective terminal pads are located, opening windows in said insulative layer to expose a portion of each terminal pad which is to be electromechanically joined to a correspondingly positioned terminal pad on the other of said chip and said substrate, depositing an alloy of germanium and the metal of which each of said terminal pads is composed through said windows and into adherent contact with the respective exposed terminal pads, until said alloy forms a bump exceeding the thickness of said insulative layer and having a periphery overlying the edges of the insulative layer forming the respective window, said alloy capable of forming a melt upon heating to the eutectic temperature of germanium and said metal, inverting said one of said chip and said substrate on which the alloy bumps are formed and bringing said bumps into engagement and registry with respective terminal pads on said other of said chip and said substrate so that each bump projects downwardly against a respective registered terminal pad, heating the alloy bumps to said eutectic temperature to produce a melt which flows away from said insulative layer and onto the respective underlying registered terminal pad, and cooling the melt to form a solid eutectic alloy bond between the terminals pads in registry on said chip and said substrate.

2. The method according to claim 1, further including applying pressure to said alloy bumps during said heating step.

3. The method according to claim 1, further including applying ultrasonic energy to the interface between said alloy bumps and the underlying terminal pads during said heating step.

4. A method of producing a strong mechanical and electrical junction between an electrical contact pad on a planar surface of one body and an electrical contact pad on a planar surface of another body, wherein each of said contact pads is composed of the same metal selected from the group consisting of gold, silver, and aluminum, said method comprising forming a thin layer of dielectric material over the surface of one of said bodies including the surface of said contact pad thereon, etching an opening in said dielectric layer to expose the surface of the underlying contact pad, depositing an alloy of germanium and said metal on the exposed surface of said contact pad and over the surrounding edge of said dielectric layer to form a raised terminal region adherently bonded to the contact pad, said alloy capable of forming a melt upon heating to the eutectic temperature of germanium and said metal, positioning said bodies so that the raised terminal region projects downwardly from the contact pad to which it is adherently bonded and against the other contact pad, heating the raised terminal region to a temperature sufficient to form a molten eutectic composition of germanium and said metal and continuing said heating until said composition recedes from said dielectric layer and flows onto the surface of the underlying said other contact pad while maintaining contact with the surface of said contact pad to which the terminal region was initially bonded, and thereafter permitting the eutectic composition to cool to form a solid junction between the two contact pads.

5. The method according to claim 4, wherein pressure is applied to force said raised terminal region against said other contact pad during the heating thereof.

6. The method according to Claim 4, further including applying ultrasonic energy to the raised terminal region during the heating thereof.

* * * * *